United States Patent [19]

Gostic et al.

[11] Patent Number: 5,074,925
[45] Date of Patent: Dec. 24, 1991

[54] THERMOMECHANICAL FABRICATION OF NET SHAPE SINGLE CRYSTAL AIRFOILS

[75] Inventors: William J. Gostic, Tequesta; John A. Miller, Jupiter, both of Fla.

[73] Assignee: The United States of America as represented by the Secretary of the Air Force, Washington, D.C.

[21] Appl. No.: 543,285

[22] Filed: Jun. 25, 1990

[51] Int. Cl.$^5$ .................................................. C22F 1/10
[52] U.S. Cl. ........................ 148/11.5 R; 148/11.5 N; 148/12.7 N; 148/162; 148/404; 148/409
[58] Field of Search .................... 148/11.5 N, 11.5 R, 148/12.7 N, 162, 404, 409

[56] References Cited

U.S. PATENT DOCUMENTS

| | | | |
|---|---|---|---|
| 3,147,155 | 9/1964 | Lamb | 148/11.5 N |
| 3,494,709 | 2/1970 | Piercey | 416/232 |
| 3,519,503 | 7/1970 | Moore | 148/11.5 N |
| 3,642,543 | 2/1972 | Owczarski et al. | 148/12.7 N |
| 3,676,225 | 7/1972 | Owczarski et al. | 148/12.7 N |
| 4,209,348 | 6/1980 | Duhl et al. | 148/3 |
| 4,385,939 | 5/1983 | Kortovich et al. | 148/2 |
| 4,528,048 | 7/1985 | Gell et al. | 148/404 |
| 4,529,452 | 7/1985 | Walker | 148/11.5 N |
| 4,728,258 | 3/1988 | Blazek et al. | 415/137 |
| 4,814,360 | 4/1989 | Giamei et al. | 420/454 |

Primary Examiner—R. Dean
Assistant Examiner—Robert R. Koehler
Attorney, Agent, or Firm—Fredric L. Singer; Donald J. Singer

[57] ABSTRACT

A thermomechanical method for fabricating net shape single crystal airfoils is disclosed. A cast single crystal superalloy workpiece is solution heat treated to provide a homogeneous gamma prime distrubition. The single crystal sheet stock is then warm worked, generally forged or rolled, at a working temperature of gamma prime solvus minus about 50°-300° F. with a maximum six percent deformation per pass. Following the first warm working, the single crystal sheet stock is cyclic annealed in a temperature range of gamma prime solvus minus about 50°-125° F. to prevent recrystallization of the single crystal sheet stock. The cyclic annealing is preferably cycled three to ten times between the low and high ends of the temperature range at a rate of change of temperature between about 1° F. per minute to about 10° F. per minute. The single crystal sheet stock is then again warm worked at the described temperatures and deformations, followed by another cyclic annealing step to prevent recrystallization. The alternating working and cyclic annealing steps are repeated until the sheet stock has achieved a desired final net shape of the airfoil.

4 Claims, No Drawings

THERMOMECHANICAL FABRICATION OF NET SHAPE SINGLE CRYSTAL AIRFOILS

RIGHTS OF THE GOVERNMENT

The invention described herein may be manufactured and used by or for the Government of the United States for all governmental purposes without the payment of any royalty.

BACKGROUND OF THE INVENTION

The present invention relates generally to methods for fabricating components for gas turbine engines, such as aircraft jet engines, and more specifically to a novel thermomechanical method for fabricating net shape airfoils from single crystal sheet stock.

Superalloys are metal alloys developed to withstand severe mechanical stresses at very high temperatures. Superalloys are generally nickel-based and achieve their very high strength primarily from the mechanical reinforcement effect of a relatively large volume of a gamma prime ($\gamma'$) precipitate phase of nickel, and other elements such as titanium and aluminum, coherently interspersed within a more continuous matrix of a gamma ($\gamma$) phase. The gamma prime phase contributes to high strength primarily by resisting dislocation movement. Unfortunately, as the volume portion of gamma prime increases, the increasing resistance to dislocations makes the superalloy harder and harder to thermomechanically work, as in forging or rolling. The highest strength superalloys with very high volume fractions of gamma prime are essentially unworkable and must be cast and then machined to a final net shape.

Superalloys are made even stronger by eliminating grain boundries where slippage and breaks can occur. Single crystal superalloys are commonly used to eliminate grain boundaries and achieve the highest possible high temperature creep strength, which is especially valuable for use in aircraft jet engine rotor blades and other airfoils. Single crystal airfoils are even more difficult to work than polycrystalline superalloys, so that they are most often cast to oversize near net shapes and then machined to their final net shapes. The cost of machining and from material loss can contribute to the high cost of such aircraft engine components.

The prior art includes methods for working polycrystalline superalloys to increase their high temperature strength. Such methods include working the polycrystalline superalloy at high temperatures after annealing and/or aging steps. The prior art also includes working single crystal superalloys to increase their hardness and strength at intermediate temperatures.

Single crystal superalloys should be simpler to work than polycrystalline superalloys because they lack the complication of grain boundary strengthening additives necessary to provide high temperature strength to the polycrystalline superalloys. Unfortunately, the worked single crystal superalloys are very susceptible to recrystallization from the high temperatures that can occur during working and use. Without the presence of additives to inhibit movement along grain boundaries, the recrystallized, formerly single crystal, superalloy components have a greatly increased potential for failure. Thus, in the practical manufacture of single crystal nickel superalloys, thermomechanical working has not been considered an option.

Thus it is seen that there is a need for a practical thermomechanical method for producing net shape airfoils from single crystal sheet stock that eliminates the costs associated with machining parts from oversize castings.

It is, therefore, a principal object of the present invention to provide a thermomechanical method for producing net shape airfoils from single crystal sheet stock that eliminates the need for machining oversize castings while preserving the high temperature strength of the single crystal and avoiding recrystallization.

It is a feature of the present invention that it uses a method for preventing recrystallization of worked single crystal sheet stock that can be easily adapted for other uses.

It is an advantage of the present invention that its implementation is straightforward and uncomplicated, using conventional equipment.

These and other objects, features and advantages of the present invention will become apparent as the description of certain representative embodiments proceeds.

SUMMARY OF THE INVENTION

The present invention provides a novel method for making net shape single crystal airfoils from single crystal sheet stock. The unique discovery of the present invention is that, after solution heat treating the single crystal sheet stock to yield a homogeneous gamma prime ($\gamma'$) distribution, a cyclic annealing heat treatment at temperatures of gamma prime solvus minus 50°–125° F., alternated with forging or rolling steps at working temperatures of gamma prime solvus minus 50°–300° F., with a maximum six percent deformation per pass, will produce a net shape single crystal with minimum machining cost and material waste and without recrystallization. The cyclic annealing steps makes possible successful thermomechanical fabrication of single crystal sheet stock.

Accordingly, the present invention is directed to a method for making net shape single crystal parts from single crystal stock, comprising the steps of solution heat treating the single crystal stock to yield a homogeneous gamma prime distribution, alternately warm working and annealing the single crystal stock until the desired net shape is achieved, wherein the working temperature is gamma prime solvus minus about 50°–300° F. with a maximum six percent deformation per pass, and wherein the annealing heat treatment is cyclic in the temperature range of gamma prime solvus minus 50°–125° F. to prevent recrystallization of the single crystal stock. Each cyclic annealing heat treatment may comprise three to ten cycles between the low and high ends of the stated temperature range at a rate of change of temperature between about 1° F. per minute to about 10° F. per minute.

DETAILED DESCRIPTION

The advantages of single crystal superalloys, particularly their resistance to high temperature creep, has made their use, regardless of cost and difficulties of making desired final net shapes, standard in military and commercial aircraft jet engines. To achieve these advantages, a standard sequence of forming steps has evolved in the art. First, a cast single crystal superalloy workpiece is solution heat treated. Solution heat treating involves heating the single crystal workpiece to a temperature slightly below the solidus temperature of the single crystal workpiece for a sufficient period of time to cause the gamma prime phase to go into solution with the gamma phase, followed by cooling so that the gamma prime phase precipitates out with a more homogeneous gamma prime distribution.

In the present invention, a solution heat treated single crystal section of sheet stock is warm worked, generally forged or rolled, at a working temperature of gamma prime solvus minus about 50°–300° F. with a maximum six percent deformation per pass. Following the first warm working, the single crystal sheet stock is cyclic annealed in a temperature range of gamma prime solvus minus about 50°–125° F. to prevent recrystallization of the single crystal sheet stock. The cyclic annealing is preferably cycled three to ten times between the low and high ends of the temperature range at a rate of change of temperature between about 1° F. per minute to about 10° F. per minute. The rate of change of temperature is largely determined by the rate of change capable of being maintained by the furnace being used, 1° F. per minute having worked well with typical furnaces. Next, the single crystal sheet stock is again warm worked at a working temperature of gamma prime solvus minus about 50°–300° F. with a maximum six percent deformation per pass, followed by another cyclic annealing step to prevent recrystallization. The alternating working and cyclic annealing steps are repeated until the sheet stock has achieved a desired final net shape of the airfoil.

The working and cyclic annealing steps are preferably alternated, but a series of thermomechanical working steps that together produce a total deformation of not more than six percent may also be alternated with the cyclic annealing step.

Those with skill in the art of the invention will see that the use of the term "warm" modifying working is merely a semantic choice. While the working is performed at a relatively high temperature, hot working implies a workpiece temperature closer to or greater than gamma prime solvus. In any event, the temperature range described in the claims is the intended limits for that element of the invention.

Those with skill in the art of the invention will also see that the invention may be performed with, in addition to the stated sheet stock, plate or bar stock. The term "stock" is used alone in the claims to include these and other forms of single crystal alloy that may benefit from the disclosed method.

Those with skill in the art of the invention will also see that, while superalloys are, as stated in the Background, generally nickel-based, the disclosed method may be expected to also work with other-based single crystal superalloys that have gamma prime or gamma prime-like precipitates.

Those with skill in the art of the invention will also see that channels for cooling may be electrical discharge machined into the net shape airfoils after the described fabrication, followed by conventional surface treatments for the machined surface to prevent failure.

The disclosed method for thermomechanical fabrication of net shape single crystal airfoils successfully demonstrates the use of a cyclic annealing step to prevent recrystallization in a single crystal workpiece. Although the disclosed invention is specialized, its teachings will find application in other areas where the overall general morphology of crystalline structures is desired to be maintained while other modifications to the structure are being made.

It is understood that modifications to the invention as described may be made, as might occur to one with skill in the field of the invention, within the intended scope of the claims. Therefore, all embodiments contemplated have not been shown in complete detail. Other embodiments may be developed without departing from the spirit of the invention or from the scope of the claims.

We claim:

1. A method for making net shape single crystal parts from single crystal superalloy stock having gamma prime precipitates, comprising the steps of:
   (a) solution heat treating the single crystal stock to yield a homogeneous gamma prime distribution; and,
   (b) after solution heat treating, alternately warm working and cyclically annealing the single crystal stock until the desired net shape is achieved;
      (i) wherein the working temperature is gamma prime solvus minus about 50°–300° F. with a maximum six percent deformation per pass; and,
      (ii) wherein the cyclic annealing heat treatment is cyclic in the temperature range of gamma prime solvus minus about 50°–125° F. to prevent recrystallization of the single crystal stock.

2. The method for making net shape single crystal parts according to claim 1, wherein each cyclic annealing heat treatment comprises three to ten cycles between the low and high ends of the stated temperature range at a rate of change of temperature between about 1° F. per minute to about 10° F. per minute.

3. A method for making net shape single crystal parts from single crystal nickel-based superalloy stock having gamma price precipitates, comprising the steps of:
   (a) solution heat treating the single crystal stock to yield a homogeneous gamma prime distribution; and,
   (b) after solution heat treating, alternately warm working and cyclically annealing the single crystal stock until the desired net shape is achieved;
      (i) wherein the working temperature is gamma prime solvus minus about 50°–300° F. with a maximum six percent deformation per pass; and
      (ii) wherein the cyclic annealing heat treatment is cyclic in the temperature range of gamma prime solvus minus about 50°–125° F. to prevent recrystallization of the single crystal stock.

4. The method for making net shape single crystal parts according to claim 3, wherein each cyclic annealing heat treatment comprises three to ten cycles between the low and high ends of the stated temperature range at a rate of change of temperature between about 1° F. per minute to about 10° F. per minute.

* * * * *